US012681078B2

(12) United States Patent
Wenske

(10) Patent No.: US 12,681,078 B2
(45) Date of Patent: Jul. 14, 2026

(54) PROCEDURE FOR MAKING ON-DIE-PARAMETRIC MEASUREMENTS OF CIRCUIT DEVICES

(71) Applicant: TEXAS INSTRUMENTS INCORPORATED, Dallas, TX (US)

(72) Inventor: Jordan Wenske, Richardson, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 190 days.

(21) Appl. No.: 18/398,399

(22) Filed: Dec. 28, 2023

(65) Prior Publication Data

US 2025/0216447 A1     Jul. 3, 2025

(51) Int. Cl.
| | |
|---|---|
| *G01R 31/28* | (2006.01) |
| *G01R 1/04* | (2006.01) |
| *G01R 1/067* | (2006.01) |
| *G01R 1/073* | (2006.01) |
| *G01R 1/20* | (2006.01) |
| *G01R 31/02* | (2006.01) |
| *G01R 31/26* | (2020.01) |

(52) U.S. Cl.
CPC ................................. *G01R 31/2886* (2013.01)

(58) Field of Classification Search
CPC ........ G01R 31/02; G01R 31/26; G01R 31/28; G01R 1/04; G01R 1/067; G01R 1/073; G01R 1/20
See application file for complete search history.

(56) References Cited

U.S. PATENT DOCUMENTS

| | | | | |
|---|---|---|---|---|
| 2009/0309556 A1* | 12/2009 | Franco | ............. | G01R 31/31721 |
| | | | | 323/234 |
| 2015/0323590 A1* | 11/2015 | Xu | ...................... | G01R 31/2886 |
| | | | | 324/762.02 |
| 2016/0139180 A1* | 5/2016 | Meninger | .............. | G01R 31/52 |
| | | | | 324/756.01 |

* cited by examiner

*Primary Examiner* — Neel D Shah
(74) *Attorney, Agent, or Firm* — Michael T. Gabrik; Frank D. Cimino

(57) ABSTRACT

A test structure for testing the on-die-parametric (ODP) measurements of circuit devices on a die. When no circuit devices are connected to the test structure, the test structure is configured to supply an input voltage at an input node of the test structure. While supplying the input voltage, the test structure determines a first measure of current at the input node and a first measure of voltage at an output node of the test structure. Next, while a single circuit device is connected to the test structure, the test structure is configured to adjust the input voltage until a second measure of voltage at the output node substantially matches the first measure of voltage. Next, the test structure determines a second measure of current at the input node. Finally, the test structure determines a parametric measurement of the device based on a difference between the first and second current measurements.

20 Claims, 7 Drawing Sheets

500

501 — SET $V_{FORCE}$ TO $V_x$

503 — MEASURE $I_{L(FORCE)}$ TO DETERMINE $I_{null}$

505 — MEASURE $V_{SENSE}$ TO DETERMINE $V_{null}$

507 — CONNECT DEVICE

509 — SWEEP $V_{FORCE}$ UNTIL $V_{SENSE}$ EQUALS $V_{null}$

511 — MEASURE $I_{L(FORCE)}$ TO DETERMINE $I_{on}$

513 — SUBTRACT $I_{null}$ FROM $I_{on}$ TO DETERMINE CURRENT OF THE DEVICE

PROCEDURE FOR MAKING ON-DIE-PARAMETRIC MEASUREMENTS OF CIRCUIT DEVICES

TECHNICAL FIELD

Aspects of the disclosure are related to the field of computing hardware, and in particular, to on-die-parametric testing.

BACKGROUND

On-die-parametric (ODP) test structures are structures that selectively couple to example circuit devices (e.g., devices under test or DUTs) in various configurations to test the fundamental device parameters of the DUTs on a die to infer whether other circuit devices on the same die will function properly. A die is a section of semiconducting material on which an integrated circuit may be fabricated. In testing, the ODP test structure may be used to test the different parameters (e.g., conductivity, resistivity, etc.) of the circuit devices to determine if the circuit devices are functioning properly.

Typically, ODP testing is conducted during the production phase of an associated die. For example, prior to deployment of the die, an ODP test structure is utilized to ensure the circuit devices of the die are operating as expected. In other examples, the ODP test structure is also useful as a debug tool or for gathering statistical data for data analysis.

Existing ODP testing procedures are highly sensitive to current leakage, which can lead to inaccuracies when determining the ODP measurements of a circuit device. To account for current leakage, existing techniques include dedicated testing pins which may be utilized to measure the effect of current leakage caused by the ODP test structure. For example, dedicated pins/balls may be used to ensure minimal leakage. However, the addition of dedicated testing pins provide little to no benefit to the end customer and takes away pins/balls from other potential functions on pin-limited devices.

SUMMARY

Technology is disclosed herein that improves the testing procedure for taking on-die-parametric (ODP) measurements of circuit devices that accounts for the current leakage associated with the device(s) under test, while providing the ability to use shared pins with respect to I/O or other functions. In this manner, parametric testing is improved without having to sacrifice pins/balls on pin-limited devices.

Various implementations include a test structure configured to measure the fundamental device parameters of circuit devices on a die. In one example embodiment, while the circuit devices are disconnected from the test structure, the test structure supplies an input voltage at an input node of the test structure. While supplying the input voltage, the test structure determines a first measure of current at the input node and a first measure of voltage at an output node of the test structure.

While one device of the circuit devices is connected to the test structure, the test structure adjusts the input voltage at the input node until a second measure of voltage at the output node substantially matches the first measure of voltage. When the voltages substantially match, the test structure determines a second measure of current at the input node of the test structure. Upon determining the second measure of current, the test structure determines a parametric measurement of the one device based on a difference between the first measure of current and the second measure of current. In an implementation the first measure of current is indicative of a null current leakage while the second measure of current is indicative of the current of the one device as well as an under-test current leakage.

This Summary is provided to introduce a selection of concepts in a simplified form that are further described below in the Detailed Description. It may be understood that this Overview is not intended to identify key features or essential features of the claimed subject matter, nor is it intended to be used to limit the scope of the claimed subject matter.

BRIEF DESCRIPTION OF THE DRAWINGS

Many aspects of the disclosure may be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views. While several embodiments are described in connection with these drawings, the disclosure is not limited to the embodiments disclosed herein. On the contrary, the intent is to cover all alternatives, modification's, and equivalents.

DETAILED DESCRIPTION

Figure 1:
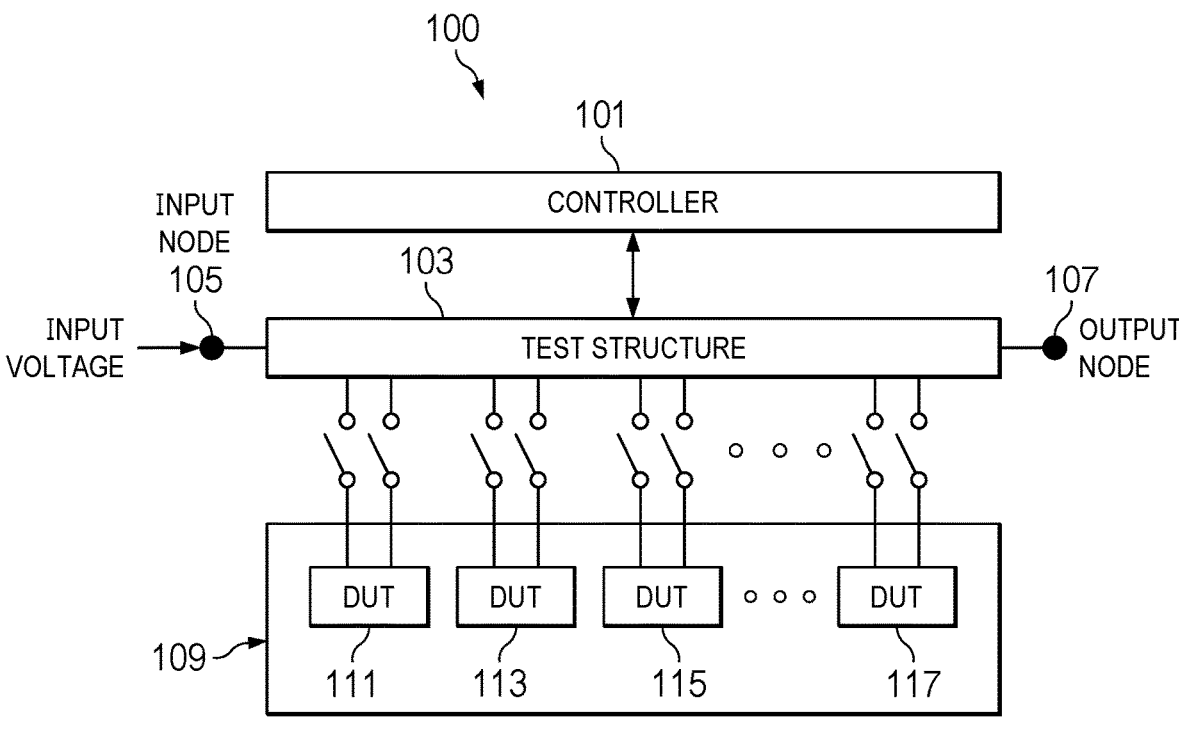
FIG. 1 illustrates a testing environment in an implementation.

Systems, methods, and devices are disclosed herein which provide an improved process for taking on-die-parametric (ODP) measurements of circuit devices on a die. The disclosed technique(s) may be implemented in the context of hardware, software, firmware, or a combination thereof to provide a method of ODP testing that mitigates sensitivity to current leakage which thereby improves the accuracy of the ODP measurements.

In various implementations, an ODP test structure is disclosed herein that may be used to perform the improved method of ODP testing. The ODP test structure is representative of a test circuit designed to test the parametric measurements of circuit devices on a die. In some examples, the ODP test structure is coupled to a controller configured to perform the method of ODP testing. In other examples, the ODP test structure includes processing resources configured to perform the method of ODP testing.

The proposed method of ODP testing is conducted in two stages. The first stage of testing describes the operations for when no circuit devices are connected to the ODP test structure. The purpose of the first stage is to identify current leakages of the ODP test structure. The second stage of testing describes operations for when a single circuit device is connected to the ODP test structure. The purpose of the second stage is to determine the current of the device-under-test (DUT) while accommodating for current leakages of the test structure.

During the first stage of testing, a voltage source supplies an input voltage at an input node of the test structure. While supplying the input voltage, a first measure of current is taken at the input node of the test structure. The first measure of current is representative of null current delivered to the DUTs, indicative of the current leakages of the test structure. Next, while still supplying the input voltage, a first measure of voltage is taken at an output node of the test structure. The first measure of voltage is representative of the voltage drop caused by the current leakage of the test structure. The first measure of voltage is further representative of a benchmark voltage, later used in the second stage of ODP testing.

Upon completion of the first stage, a single DUT is connected to the ODP test structure. During the second stage, the voltage source is adjusted (swept through a range) to supply a second input voltage, such that the second input voltage causes the voltage at the output node to be equal to the first measure of voltage. Advantageously, causing the voltage at the output node to be equal to the first measure of voltage ensures that the current leakages caused by the test structure will be approximately equal in the first and second stages.

While supplying the second input voltage, a second measure of current is taken at the input node of the test structure. The second measure of current is representative of the current of the DUT and an under-test current leakage of the test structure. Thus, the current of the DUT is determined by finding the difference between the first measure of current and the second measure of current. In an implementation the current of the DUT is used to determine the parametric measurements of the DUT. For example, if the DUT is representative of an NMOS or PMOS transistor, then the current of the DUT may be used to determine standard voltage thresholds, lower voltage thresholds, ultralow voltage thresholds, and current drive of the NMOS and PMOS transistors.

It may be appreciated that one or both of the input node and the output node may be implemented on pins shared with other device functions. For example, the input node may be implemented via a pin that is shared with device I/O or another function. Similarly, the output node may be a pin that is shared with device I/O or another function. During both the first and second stages of testing, connections to the other functions on the device may be disabled by way of switches or other suitable mechanisms.

Advantageously, the proposed ODP testing procedure accounts for the leakage of the DUT, whereas previous methods did not, thereby allowing pins to be shared between the test structure and other device functions. Since the proposed method now accounts for current leakage with greater accuracy, the accuracy of subsequent ODP measurements is improved.

Turning now to the Figures, FIG. 1 illustrates testing environment 100 in an implementation. Testing environment 100 is representative of an environment for testing the on-die-parametric (ODP) measurements of circuit devices on a die. For example, testing environment 100 may be representative of an automated testing environment configured to test the ODP measurements of DUTs on a die-by-die basis. Alternatively, testing environment 100 may include bench equipment configured to debug the components of an integrated circuit. Testing environment 100 includes controller 101, test structure 103, and die 109.

Controller 101 may be representative of a microcontroller unit (MCU) or other such computing device having processing circuitry and a memory that stores program instructions executable by the processing circuitry. When loaded to and executed by the processing circuitry, the program instructions direct controller 101 to operate in accordance with methods discussed below with respect to FIGS. 2 and 3.

Test structure 103 is representative of circuitry configured to test circuit devices on die 109 under the control of controller 101. Test structure 103 includes input node 105 and output node 107. Input node 105 is representative of a node where voltage may be supplied. For example, input node 105 may be coupled to a voltage source to provide voltage to test structure 103. Input node 105 is also representative of a node from where current measurements may be taken. For example, an ammeter may be coupled to input node 105 to collect current measurements. Output node 107 is representative of a node from where voltage measurements may be taken. For example, a voltmeter may be coupled to output node 107 to collect voltage measurements.

In an implementation, input node 105 and output node 107 are further representative of sharable pins which other components of testing environment 100 may connect to. For example, when the circuit devices of die 109 are disconnected from test structure 103, other elements may connect to input node 105 and/or output node 107.

Die 109 is representative of a block of semiconducting material which includes circuit devices thereon. In an implementation, die 109 is representative of an integrated circuit that includes circuit devices (DUTs) 111, 113, 115, and 117. Circuit devices 111-117 may be representative of a variety of circuit devices. For example, circuit devices 111-117 may be representative of transistors, resistors, capacitors, or other devices of the like. Circuit devices 111-117 are individually tested with test structure 103. For example, controller 101 may first test circuit device 111 via test structure 103, followed by circuit device 113, and so on. While illustrated herein with respect to die 109, it may be appreciated that the proposed testing methodology also applies to stand-alone circuit devices outside the context of on-die-parametric testing. That is, the testing methodology may be applied to on-chip or off-chip circuit devices, in an off-die context. In addition, while illustrated as elements separate from die 109, it may be appreciated that in some scenarios controller 101 and test structure 103 may themselves be implemented on die 109.

Figure 2:
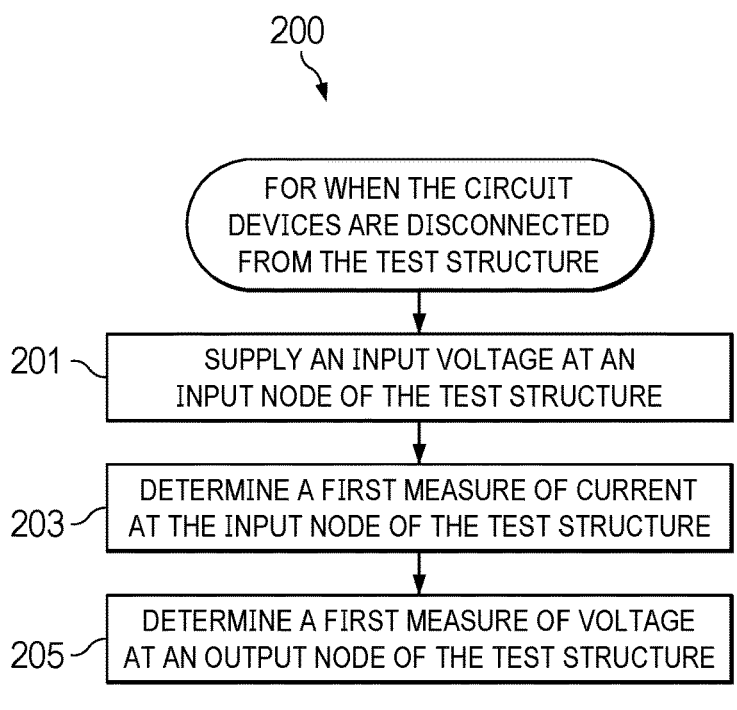
FIG. 2 illustrates a first stage of a method for taking on-die-parametric (ODP) measurements in an implementation.
Figure 3:
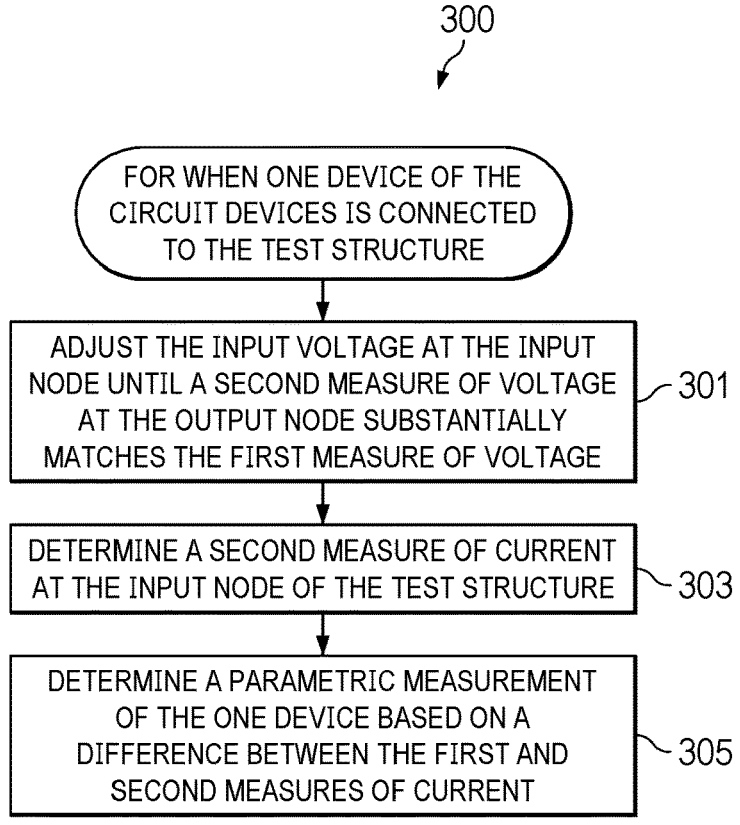
FIG. 3 illustrates a second stage of a method for taking ODP measurements in an implementation.

FIGS. 2 and 3 illustrate the first and second stages of a method, executed by the processing circuitry of controller 101, for testing on-die-parametric (ODP) measurements of circuit devices 111-117. As mentioned, controller 101 includes a memory that stores program instructions executable by the processing circuitry. When loaded to and executed by the processing circuitry, the program instructions direct controller 101 to operate in accordance with the steps of method 200 and method 300 respectively.

FIG. 2 illustrates the first stage of ODP testing, herein referred to as method 200. Method 200 describes the operations for when no devices of die 109 are connected to test structure 103. To begin, controller 101 causes a voltage source, such as an on-die voltage source or a voltage supply of test equipment coupled to input node 105, to supply an input voltage at input node 105 (step 201). While supplying the input voltage, controller 101 determines a first measure of current at input node 105 (step 203). Additionally, or in the alternative, the first measure of current may be determined by test equipment coupled to input node 105. The first measure of current is representative of a null current, indicative of the current leakage of test structure 103.

Next, while still supplying the input voltage, controller 101 determines a first measure of voltage at output node 107 (step 205). Additionally, or in the alternative, the first measure of voltage may be determined by test equipment coupled to output node 107. The first measure of voltage is representative of a null voltage caused by the current leakage of test structure 103. Further, the first measure of voltage is representative of a benchmark voltage, later used in the second stage of testing.

Now turning to FIG. 3, method 300 illustrates the second stage of ODP testing, such that method 300 describes the operations for when a single device of die 109 is connected to test structure 103. Upon collecting the first current and voltage measurements, controller 101 causes a single circuit device of die 109 (e.g., circuit device 111) to be connected to test structure 103. While the single device is connected, controller 101 adjusts the input voltage at input node 105 until a second measure of voltage at output node 107 substantially matches the first measure of voltage (step 301). To adjust the input voltage, controller 101 sweeps the voltage source across a range of voltages until the second measure of voltage is substantially equal to the first measure of voltage.

Once the first and second measures of voltage are substantially equal (meaning to within a threshold amount), controller 101 directs the voltage source to continue supplying the adjusted input voltage to input node 105. The threshold amount may be, for example, 1 mV, 0.1%, or some other suitable threshold. While supplying the adjusted input voltage, controller 101 and/or test equipment determines a second measure of current at input node 105 (step 303). The second measure of current is representative of an under-test current leakage. The under-test current leakage describes the current leakage of test structure 103, and the current of the device-under-test (DUT).

Finally, controller 101 and/or test equipment determines a parametric measurement of the DUT based on a difference between the first measure of current and the second measure of current (step 305). The first measure of current represents the current leakage of test structure 103. The second measure of current represents the current leakage of test structure 103 and the current of the DUT. Thus, the difference between the first measure of current and second measure of current is representative of the current of the DUT.

Controller 101 determines the ODP measurements of the DUT based on the current of the device. For example, if the DUT is representative of a capacitor, the current of the capacitor may be used to determine the capacitance, dissipation factor, and equivalent series resistance of the capacitor. In another example, if the DUT is representative of an oscillator, the current of the oscillator may be used to determine the oscillation speed of the oscillator.

Methods 200 and 300 may be repeated for each circuit device of die 109. For example, after determining the parametric measurements of circuit device 111, controller 101 may determine the parametric measurements of circuit device 113, followed by circuit device 115, and so on. While discussed with respect to a single device-under-test, it may be appreciated that in some implementations methods 200 and 300 may be performed in parallel with respect to two or more DUTs.

6

Figure 4A:
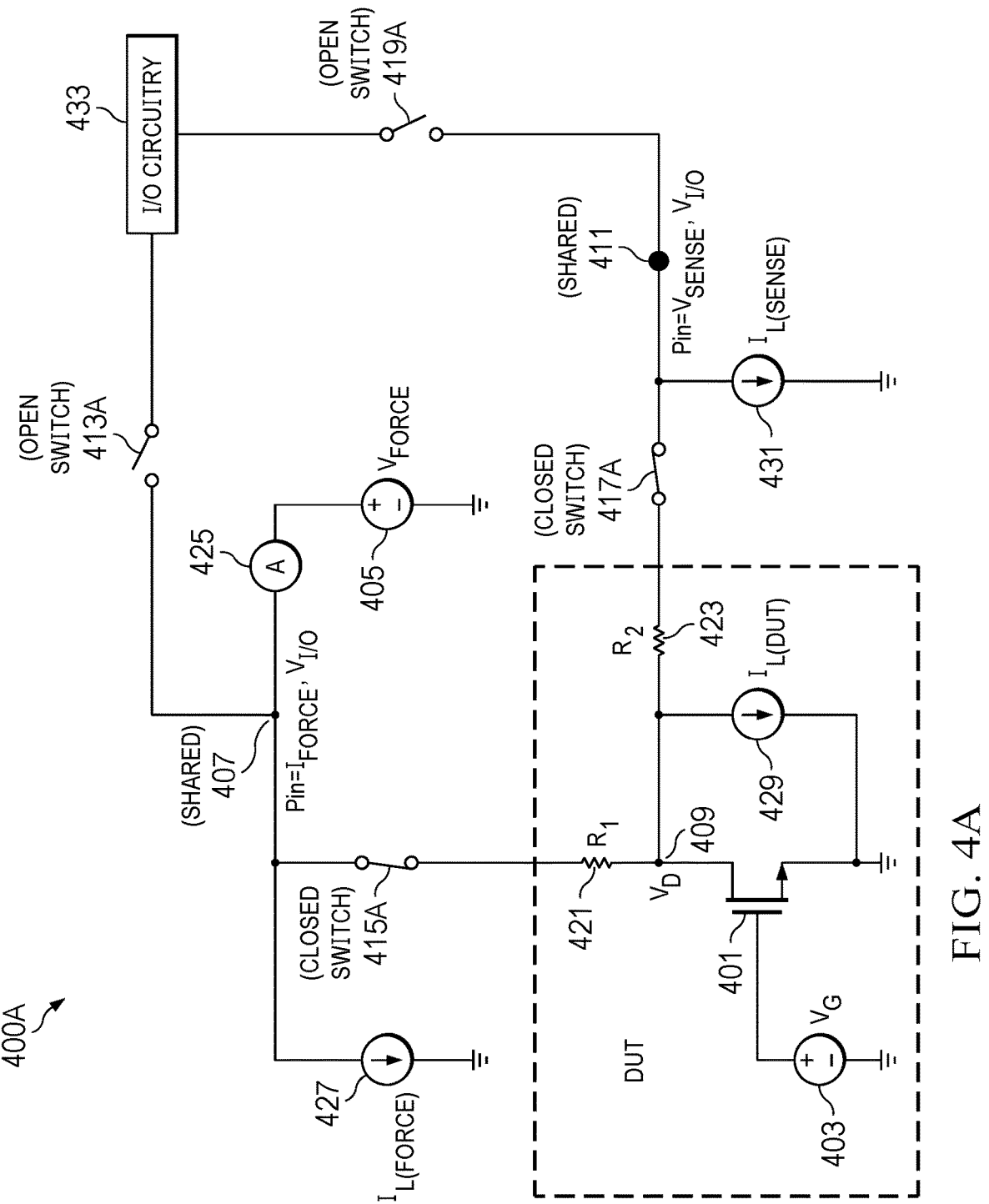
FIGS. 4A and 4B illustrate a testing circuit in an implementation.
Figure 4B:
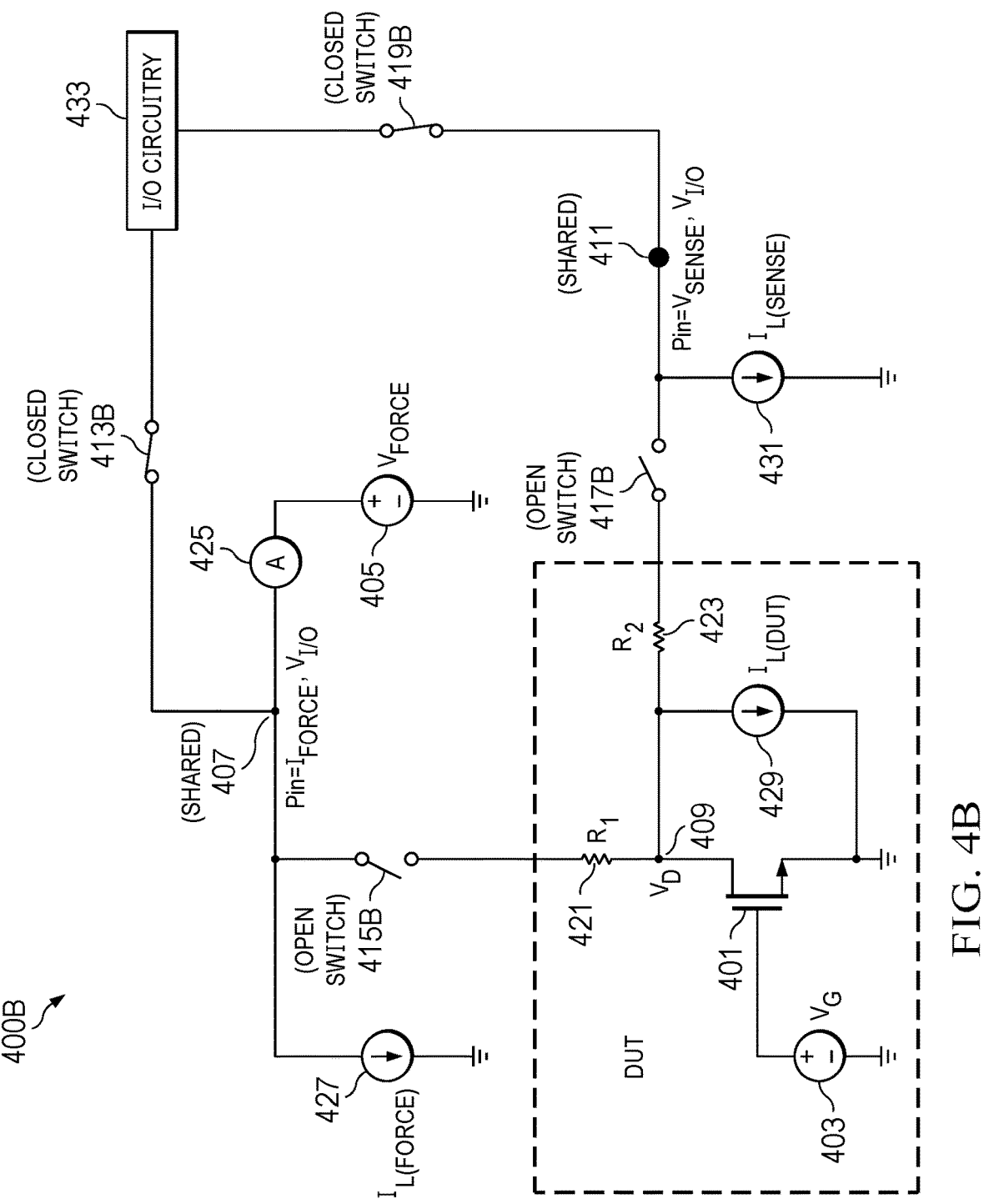

FIGS. 4A and 4B illustrate test circuits 400A and 400B respectively. Test circuit 400A is representative of circuitry (e.g., test structure 103) in a first configuration. Test circuit 400A tests the ODP measurements of circuit devices on a die (e.g., die 109). Alternatively, test circuit 400B is representative of circuitry in a second configuration. Test circuit 400B provides pins to couple to components which are external to test circuit 400B (e.g., I/O circuitry 433).

Now turning to FIG. 4A, test circuit 400A tests transistor 401 and includes voltage source 403, voltage source 405, shared pin 407, node 409, shared pin 411, switch 415A, switch 417A, resistance 421, resistance 423, and ammeter 425. Various leakage currents experienced by the test circuit are represented by current leakages 427, 429, and 431. Outside of test circuit 400A, FIG. 4A further includes switch 413A, switch 419A, and I/O circuitry 433.

Voltage source 405 is representative of a power supply which provides voltage to test circuit 400A. In an implementation, voltage source 405 is coupled to a controller configured to perform the method of ODP testing disclosed herein. For example, voltage source 405 may be coupled to controller 101 of FIG. 1. When directed, voltage source 405 supplies a specified amount of voltage (e.g., $V_{FORCE}$) to shared pin 407 of test circuit 400.

Shared pin 407 is representative of a pin where voltage may be supplied. In an implementation, when switch 413A is open and switch 415A is closed, shared pin 407 is also representative of a pin where current measurements may be taken from (i.e., $I_{FORCE}$ pin 407). For example, shared pin 407 may be coupled to ammeter 425 or a controller configured to collect current measurements of test circuit 400 (i.e., controller 101). In another implementation, when switch 413A is closed and switch 415A is open, shared pin 407 is instead representative of pin which may connect to input/output (I/O) circuitry 433, later discussed with reference to FIG. 4B.

Node 409 is representative of a node which connects to the device-under-test. For example, transistor 401 may connect to test circuit 400 at node 409. When connected, the voltage at node 409 (i.e., $V_D$) is supplied to transistor 401.

In an implementation, when switch 417A is closed and switch 419A is open, shared pin 411 is representative of a pin where voltage measurements may be taken from (i.e., $V_{SENSE}$ pin 411). For example, shared pin 411 may be coupled to a voltmeter, or a controller configured to collect voltage measurements of test circuit 400 (i.e., controller 101). In another implementation, when switch 417A is open and switch 419A is closed, shared pin 411 is instead representative of pin which may connect to I/O circuitry 433, later discussed with reference to FIG. 4B.

Switches 415A and 417A are representative of closed switches, while switches 413A and 419A are representative of open switches. In an implementation, when a circuit device is under test, switches 415A and 417A are closed, and switches 413A and 419A are opened. Alternatively, when a circuit device is not under test, switches 415A and 417A are opened, and switches 413A and 419A are closed, to allow external components, such as I/O circuitry 433, to connect to shared pin 407 and shared pin 411, later discussed in FIG. 4B.

Resistance 421 represents a first resistance of test circuit 400. Resistance 421 may be representative of a resistor, switch, or device of the like. Resistance 421 causes a first voltage drop between shared pin 407 and node 409. Resistance 421 is connected to the input of transistor 401 and occurs in series to resistance 423. Resistance 423 represents a second resistance of test circuit 400. Resistance 423 may be representative of a resistor, switch, or device of the like. Resistance 423 is connected to the output of transistor 401 and causes a second voltage drop between node 409 and shared pin 411. In an implementation, resistance 423 is higher than resistance 421. It may be appreciated that in some implementations, some or all aspects of FIGS. 4A and 4B may be combined with some or all aspects of FIG. 6. For example, test circuit 400A/400B may be representative of test structure 603 such that resistances 421 and 423 are depicted as switches.

Current leakages 427, 429, and 431 represent the current leakages of test circuit 400. Current leakage 427 describes the difference in the current measured at shared pin 407 and the current measured before resistance 421. More specifically current leakage 427 measures the amount of current from shared pin 407 which is not supplied to the DUT (as represented by the dotted box). Current leakage 429 represents the current leakage between resistance 421 and resistance 423. In an implementation, current leakage 429 describes the current leakage of transistor 401. Current leakage 431 represents the current measured after resistance 423. Current leakage 431 describes the current that leaves the DUT (as represented by the dotted box).

Transistor 401 represents the device-under-test (DUT). Although illustrated as a transistor, transistor 401 may be representative of any type of circuit device, such as an oscillator, a resistor, or another device of the like. In an implementation transistor 401 represents a device on a die. For example, transistor 401 may represent the devices of die 109 of FIG. 1.

Transistor 401 may be connected to or disconnected from test circuit 400 via voltage source 403. To disconnect transistor 401 from test circuit 400, voltage source 403 supplies a zero signal to transistor 401. In response, transistor 401 acts as an open switch. Alternatively, to connect transistor 401 to test circuit 400, voltage source 403 supplies an input voltage to transistor 401. In response, transistor 401 acts as a closed switch.

Now turning to FIG. 4B, test circuit 400B includes the same elements as test circuit 400A, but switches 415A and 417A are now represented in the open position while switches 413A and 419A are now represented in the closed position. Test circuit 400B includes transistor 401, voltage sources 403 and 405, shared pin 407, node 409, shared pin 411, switches 415B and 417B, resistances 421 and 423, ammeter 425, and current leakages 427, 429, and 431. Outside of test circuit 400B, FIG. 4B also includes switch 413B, switch 419B, and I/O circuitry 433.

Switches 415B and 417B represent the opened variations of switches 415A and 417A. Similarly, switches 413B and 419B represent the closed variations of switches 413A and 419A. When switches 415B and 417B are opened, and switches 413B and 419B are closed, shared pin 407 (i.e., $V_{I/O}$ pin 407) and shared pin 411 (i.e., $V_{I/O}$ pin 411) behave as pins which I/O circuitry 433 may connect to. I/O circuitry 433 is representative of circuitry which receives voltage from voltage source 405. In an implementation, switches 413A/B and 415A/B represent a singular 2-state switch, while switches 417A/B and 419A/B also represent a 2-state switch.

It may be appreciated that test circuits 400A and 400B may be employed in a larger context to provide an environment for automated testing of circuit devices. For example, test circuits 400A and 400B may be coupled to automatic test equipment (ATE) configured to perform the method of ODP testing later discussed in FIG. 5. ATE represents any type of apparatus which tests devices using automation to quickly take measurements and evaluate test results. For example, ATE can represent a simple computer-controlled digital multimeter or a more complicated system containing dozens of testing instruments. In some examples ATE includes ammeter 425 and voltage source 405.

ATE systems which perform tests on circuit devices typically include multiple computer-controlled instruments which measure and calibrate a wide range of parameters. For example, such instruments may include a measurement unit coupled to a control unit. The measurement unit takes various current and voltage measurements of test circuit 400. For example, the measurement unit may be coupled to shared pin 407 and shared pin 411 to collect current and voltage measurements respectively. It should be noted that the measurement unit may collect current and voltage measurements when switches 415A and 417A are closed and switches 413A and 419A are opened. The control unit calibrates the ODP measurements of the device-under-test based on the collected measurements. For example, the control unit may calibrate the ODP measurements of transistor 401.

Figure 5:
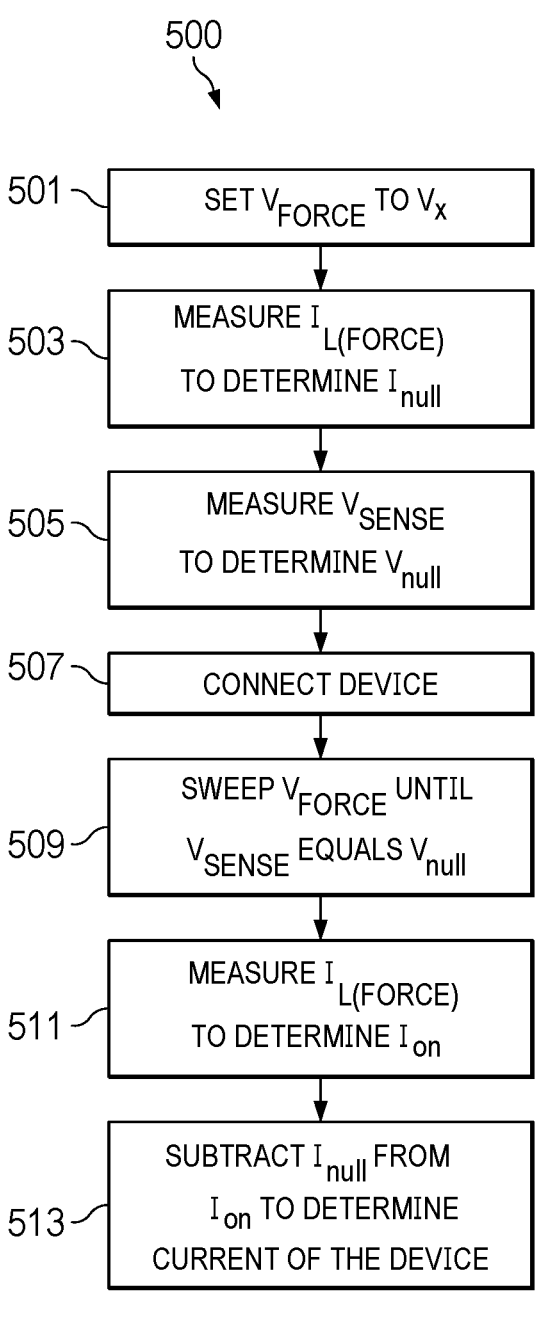
FIG. 5 illustrates a process for taking ODP measurements in an implementation.

FIG. 5 illustrates ODP measurement process 500 for a controller (e.g., controller 101 and/or a controller of an ATE) configured to test the ODP measurements of circuit devices on a die. ODP measurement process 500 is conducted in two stages such that the first stage describes the operations for no devices are connected to an ODP test circuit and the second stage describes the operations for when a single device is connected to the ODP test circuit. For the purposes of explanation, ODP measurement process 500 will be explained in the context of FIG. 4A. This is not meant to limit the applications of this process, but rather to provide an example.

To begin the first stage of testing, a controller associated with test circuit 400 (e.g., an ATE controller and/or an on-die controller) sets voltage source 405 to a first voltage (i.e., $V_x$) (step 501) while transistor 401 is disconnected from test circuit 400. In an implementation, to disconnect transistor 401 from test circuit 400, voltage source 403 supplies a zero signal to transistor 401. In response, transistor 401 behaves like an open switch. In another implementation, transistor 401 is physically disconnected from node 409.

While voltage source 405 supplies the first voltage, the controller determines a first measure of current at shared pin 407 (step 503). The first measure of current is representative of a null current (i.e., $I_{null}$) which describes the current leakages of test circuit 400. Next, the controller determines a first measure of voltage at shared pin 411 (step 505). The first measure of voltage is representative of a null voltage (i.e., $V_{null}$) which describes the voltage drops caused by the current leakages of test circuit 400. In an implementation, shared pin 407 and shared pin 411 are coupled to a measurement unit configured to collect current and voltage measurements respectively.

Next, to begin the second stage of testing, transistor 401 is connected to test circuit 400 (step 507). In an implementation, to connect transistor 401 to test circuit 400, voltage source 403 supplies an input voltage to transistor 401. In response, transistor 401 behaves like a closed switch. In another implementation, transistor 401 is physically connected to node 409.

Once connected, the controller sweeps voltage source 405 until the voltage reading at shared pin 411 is equal to first measure of voltage (i.e., $V_{null}$) (step 509). Advantageously, forcing the voltage at shared pin 411 to equal $V_{null}$ ensures that the voltage at node 409 will be approximately equal for when transistor 401 is disconnected from or connected to node 409.

For example, when transistor 401 is disconnected from node 409, the voltage at node 409 can be found with the following equation:

$$V_{D(null)} = V_{FORCE} - R_1 * (I_{L(DUT)} + I_{L(SENSE)})$$

Such that $V_{D(null)}$ represents the voltage at node 409 when transistor 401 is disconnected from test circuit 400, $V_{FORCE}$ represents the voltage supplied by voltage source 405, $R_1$ represents the resistance of resistance 421, $I_{L(DUT)}$ represents current leakage 429, and $I_{L(SENSE)}$ represents current leakage 431. Thus, $V_{D(null)}$ is equal to the voltage supplied by voltage source 405 minus the voltage drop across resistance 421. $V_{D(null)}$ may be further represented with the following equation:

$$V_{D(null)} = V_{SENSE(null)} + R_2 * I_{L(SENSE)}$$

Such that $V_{D(null)}$ represents the voltage at node 409 when transistor 401 is disconnected from test circuit 400, $V_{SENSE}$ (null) represents the voltage at shared pin 411 when transistor 401 is disconnected from test circuit 400, $R_2$ represents the resistance of resistance 423, and $I_{L(SENSE)}$ represents current leakage 431. Thus, $V_{D(null)}$ is equal to the voltage at shared pin 411 plus the voltage drop across resistance 423.

Alternatively, when transistor 401 is connected to node 409, the voltage at node 409 can be found with the following equation:

$$V_{D(on)} = V_{FORCE} - R_1 * (I_{L(DUT)} + I_{DUT} + I_{L(SENSE)})$$

Such that $V_{D(on)}$ represents the voltage at node 409 when transistor 401 is connected to test circuit 400, $V_{FORCE}$ represents the voltage supplied by voltage source 405, $R_1$ represents the resistance of resistance 421, $I_{L(DUT)}$ represents current leakage 429, $I_{DUT}$ represents the current of transistor 401, and $I_{L(SENSE)}$ represents current leakage 431. Thus, $V_{D(on)}$ is equal to the voltage supplied by voltage source 405 minus the voltage drop across resistance 421. $V_{D(on)}$ may be further represented with the following equation:

$$V_{D(on)} = V_{SENSE(on)} + R_2 * I_{L(SENSE)}$$

Such that $V_{D(on)}$ represents the voltage at node 409 when transistor 401 is connected to test circuit 400, $V_{SENSE(on)}$ represents the voltage at shared pin 411 when transistor 401 is connected to test circuit 400, $R_2$ represents the resistance of resistance 423, and $I_{L(SENSE)}$ represents current leakage 431. Thus, $V_{D(on)}$ is equal to the voltage at shared pin 411 for when transistor 401 is connected to test circuit 400 plus the voltage drop across resistance 423.

To ensure $V_{D(null)} = V_{D(on)}$, ODP measurement process 500 forces the voltage at shared pin 411 to be equal during the first and second stages of testing (i.e., $V_{SENSE(null)} = V_{SENSE(on)}$). As a result, ODP measurement process 500 acquires more accurate ODP measurements without sensitivity to current leakages 427, 429, and 431.

Next, while voltage source 405 supplies the adjusted voltage, the controller determines a second measure of current at shared pin 407 (step 511). The second measure of current is representative of an on current (i.e., $I_{on}$) which describes the current leakages of test circuit 400 and the current of transistor 401.

To determine the current of transistor 401, the controller subtracts the first measure of current from the second measure of current (i.e., $I_{DUT} = I_{on} - I_{null}$) (step 513). Next, the controller utilizes the current of transistor 401 to calibrate the remaining parametric measurements. For example, the controller may calibrate the upper and lower voltage thresholds of transistor 401 based on the identified current. In an implementation, a control unit is used to calibrate the remaining parametric measures of transistor 401.

Experimental results related to the disclosed technology demonstrate an improvement in accuracy for determining ODP measurements of circuit devices. For example, in one experiment, the proposed method displayed an increase of 14.15% in accuracy, as compared to the previous method for determining ODP measurements of circuit devices.

Figure 6:
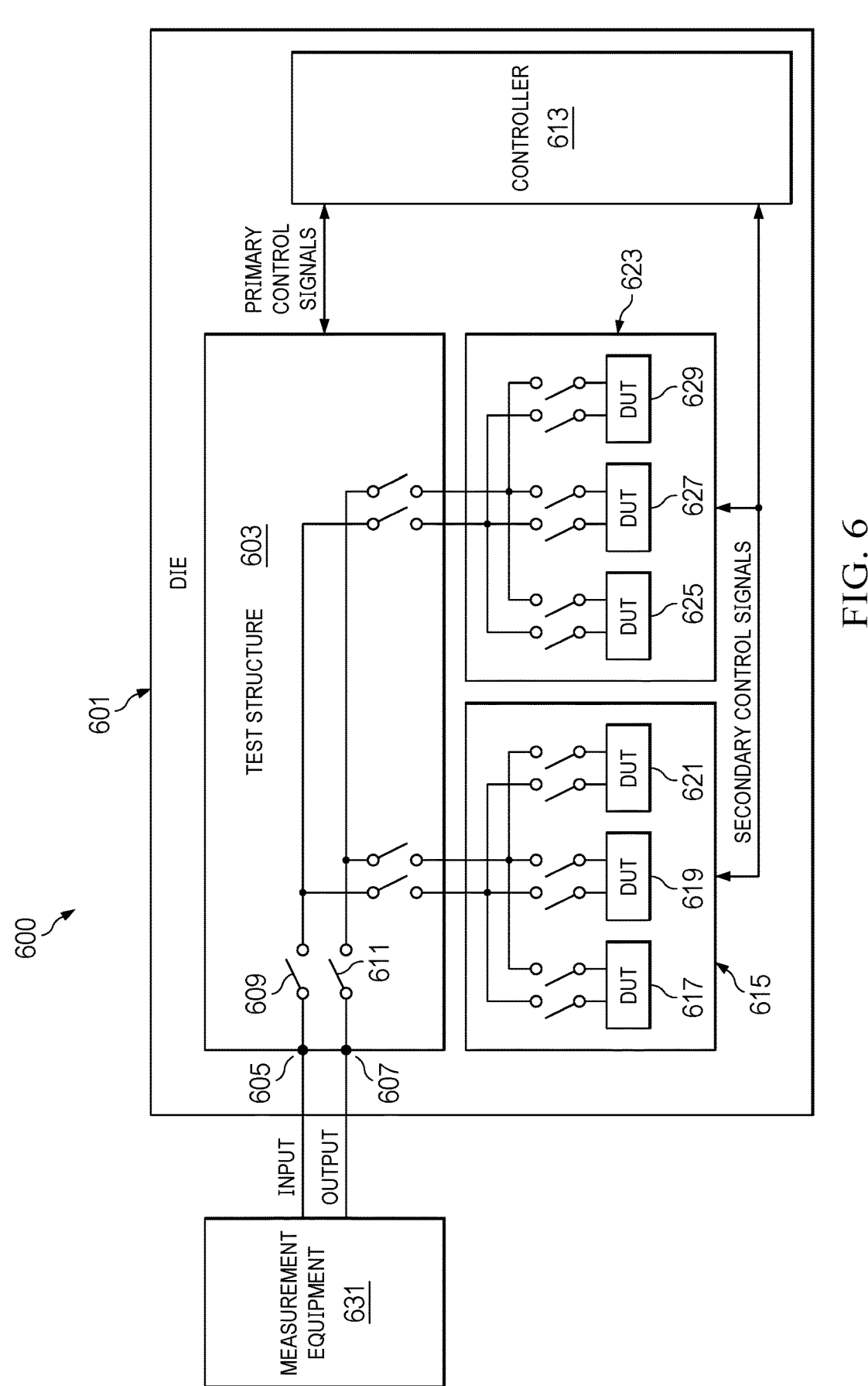
FIG. 6 illustrates another testing environment in an implementation.

FIG. 6 illustrates testing environment 600 in an implementation. Testing environment 600 is representative of an environment configured to test the ODP measurements of circuit devices. Testing environment 600 includes die 601 and measurement equipment 631.

Die 601 is representative of a block of semiconducting material which includes circuit devices thereon. In an implementation, die 601 is representative of a microcontroller unit (MCU), configured to test the ODP measurements of the on-board circuit devices (e.g., DUTs circuit device 617, 619, 621, 625, 627, and 629). Die 601 includes test structure 603, controller 613, and device arrays 615 and 623.

Test structure 603 is representative of circuitry configured to test the on-board circuit devices of die 601. For example, test structure 603 may be representative of test circuit 400A or test circuit 400B. Test structure 603 includes input pin 605, output pin 607, switch 609, and switch 611. In an implementation, the behavior of input pin 605 and output pin 607 are dependent on the state of switches 609 and 611. For example, when switches 609 and 611 are closed, input pin 605 and output pin 607 act as pins where voltage may be supplied, and measurements may be taken from. Alternatively, when switches 609 and 611 are open, input pin 605 and output pin 607 act as shareable pins. For example, devices of die 601, or devices external to die 601, may connect to input pin 605 and output pin 607 when switches 609 and 611 are open.

Input pin 605 is representative of a pin where voltage may be supplied. For example, input pin 605 may be coupled to a voltage source configured to provide voltage to test structure 603. When switches 609 and 611 are closed, input pin 605 is further representative of a node where current measurements may be taken from. For example, measurement equipment 631 may include an ammeter configured to collect current measurements at input pin 605. When switches 609 and 611 are open, input pin 605 is instead representative of a pin which components of die 601 may connect to. For example, a GPIO of die 601 may connect to input pin 605 to receive or drive a voltage. In an implementation, input pin 605 is representative of shared pin 407 of FIGS. 4A and 4B.

Output pin 607 is representative of a node where voltage measurements may be taken from such that switches 609 and 611 are closed. For example, measurement equipment 631 may include a voltmeter configured to collect voltage measurements at output pin 607. Alternatively, output pin 607 is representative of a sharable pin which components may connect to when switches 609 and 611 are open. In an implementation, output pin 607 is representative of shared pin 411 of FIGS. 4A and 4B.

Switches 609 and 611 are representative of switches which determine the behavior of input pin 605 and output pin 607. For example switch 609 may be representative of switches 413A/B and 415A/B of FIGS. 4A and 4B, while switch 611 is representative of switches 417A/B and 419A/B of FIGS. 4A and 4B. In an implementation, when a circuit device is under test, switches 609 and 611 are closed. Else, switches 609 and 611 are open.

In an implementation, test structure 603 is representative of an analog multiplexer with two layers of switches. The first layer of switches connects to a specific device array (e.g., device array 615 or device array 623). While the second layer of switches connects to a specific circuit device of the respective device array. In an implementation, the switches of test structure 603 are representative of resistance 421 and resistance 423. For example, when circuit device 617 is under test (and switches 609 and 611 are closed), the set of switches between input pin 605 and circuit device 617 represents resistance 421. Alternatively, the set of switches between circuit device 617 and output pin 607 represents resistance 423.

Controller 613 is representative of a computing device having processing circuitry and a memory that stores program instructions, executable by the processing circuitry. When loaded to and executed by the processing circuitry, the program instructions direct controller 613 to perform the method of ODP testing disclosed herein. For example, controller 613 may include a processor configured to execute methods 200 and 300 or ODP measurement process 500. In operation, controller 613 generates control signals for test structure 603 and device arrays 615 and 623, such that the control signals direct test structure 603 to connect to a single circuit device of either device array 615 or device array 623.

Device arrays 615 and 623 represent sets of circuit devices. Device array 615 includes circuit devices 617, 619, and 621, while device array 623 includes circuit device 625, 627, and 629. Circuit devices 617-621 and 625-629 may be representative of a variety of circuit devices. For example, circuit devices 617-621 and 625-629 may represent transistors, resistors, capacitors, or other devices of the like. Circuit devices 617-621 and 625-629 are individually tested by test structure 603, controller 613 and measurement equipment 631.

Measurement equipment 631 is representative of equipment configured to collect the required measurements for performing the method of ODP testing disclosed herein. For example, measurement equipment 631 may be representative of an ATE system, bench equipment, or something of the like. While illustrated as separate elements, it may be appreciated that in some scenarios measurement equipment 631 may be implemented on die 601.

Measurement equipment 631 includes an ammeter and a voltmeter configured to collect current and voltage measurements at input pin 605 and output pin 607 respectively. In an implementation measurement equipment 631 includes processing circuitry configured to calibrate the collected measurements of test structure 603 to determine the ODP measurements of the circuit device under test. For example, measurement equipment 631 may include a processor configured to execute methods 200 and 300 or ODP measurement process 500. In another implementation, measurement equipment 631 provides the collected measurements to controller 613 configured to determine the ODP measurements of the circuit device under test.

In a brief example, to perform the method of ODP testing, switches 609 and 611 are first closed. Once closed, controller 613 directs a voltage source to supply an input voltage to input pin 605, while test structure 603 is disconnected from device arrays 615 and 623.

While supplying the input voltage, measurement equipment 631 determines a first measure of current at input pin 605. The first measure of current is representative of a null current which describes the current leakages of test structure 603. Next, while still supplying the input voltage, measurement equipment 631 determines a first measure of voltage at output pin 607. The first measure of voltage is representative of a null voltage which describes the voltage drops caused by the current leakages of test structure 603.

Next, controller 613 sends out control signals to test structure 603 and device array 615. The primary control signal directs test structure 603 to connect to device array 615. The secondary control signal directs device array 615 to connect circuit device 617 to test structure 603. It should be noted that for the purposes of explanation, circuit device 617 will be discussed herein. This is not meant to limit the applications of the remaining circuit devices, but rather to provide an example.

Once connected, controller 613 directs the voltage source to adjust the input voltage until the voltage reading at output pin 607 is substantially equal to the first measure of voltage. Once substantially equal, measurement equipment 631 determines a second measure of current at input pin 605 (while the voltage source supplies the adjusted voltage). The second measure of current is representative of an on current which describes the current leakages of test structure 603 and the current of circuit device 617.

To determine the current of circuit device 617, controller 613 subtracts the first measure of current from the second measure of current. Finally, controller 613 utilizes the current of circuit device 617 to calibrate the remaining parametric measurements. For example, if circuit device 617 is representative a transistor, controller 613 may calibrate the upper and lower voltage thresholds of the transistor based on the identified current.

Figure 7:
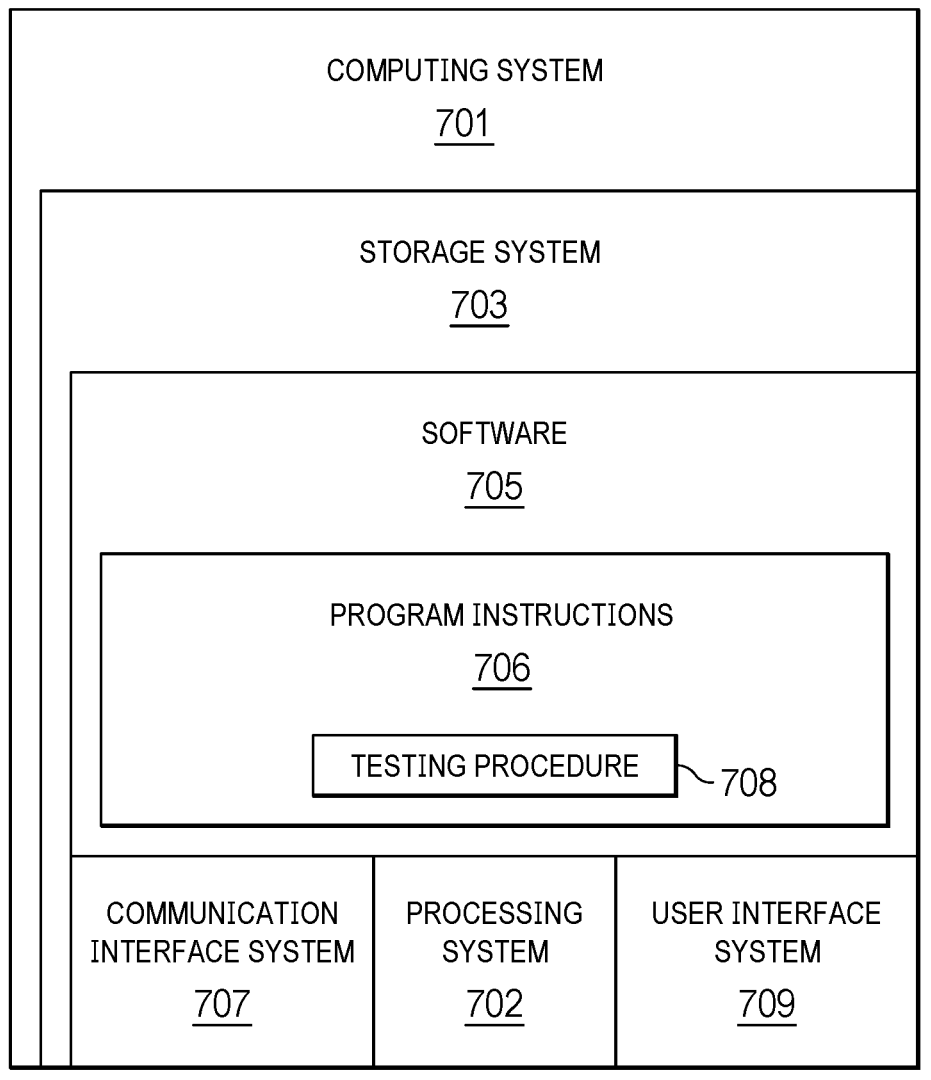
FIG. 7 illustrates a computing system suitable for implementing the various operational environments, architectures, processes, scenarios, and sequences discussed below with respect to the other Figures.

It may be appreciated that the foregoing implementations may be implemented in the context of a variety of computing devices including—but not limited to—embedded computing devices, industrial computers, personal computers, server computers, automotive computers, MCUs, and the like. As such, the technology disclosed herein also contemplates software products produced by compilers capable of generating binary convolution instructions as disclosed herein. That is, the technology disclosed herein includes compiled software programs having binary convolution instructions amongst their program instructions. FIG. 7 illustrates computing device 701, which is representative of such computers.

Computing device 701 may be implemented as a single apparatus, system, or device or may be implemented in a distributed manner as multiple apparatuses, systems, or devices. Computing device 701 includes, but is not limited to, processing system 702, storage system 703, software 705, communication interface system 707, and user interface system 709 (optional). Processing system 702 is operatively coupled to storage system 703, communication interface system 707, and user interface system 709.

Processing system 702 loads and executes software 705 from storage system 703. Software 705 includes program instructions 706, which includes testing procedure 708. When executed by processing system 702, software 705 directs processing system 702 to operate as described herein for at least the various processes, operational scenarios, and sequences discussed in the foregoing implementations. Computing device 701 may optionally include additional devices, features, or functions not discussed for purposes of brevity.

Referring still to FIG. 7, processing system 702 may comprise a micro-processor and other circuitry that retrieves and executes software 705 from storage system 703. Processing system 702 may be implemented within a single processing device but may also be distributed across multiple processing devices or sub-systems that cooperate in executing program instructions. Examples of processing system 702 include one or more general purpose central processing units, graphical processing units, microprocessors, digital signal processors, field-programmable gate arrays, application specific processors, processing circuitry, analog circuitry, digital circuitry, and logic devices, as well as any other type of processing device, combinations, or variations thereof.

Storage system 703 may comprise any computer readable storage media readable by processing system 702 and capable of storing software 705. Storage system 703 may include volatile and nonvolatile, removable and non-removable media implemented in any method or technology for storage of information, such as computer readable instructions, data structures, program modules, or other data. Examples of storage media include random access memory, read only memory, magnetic disks, optical disks, flash memory, virtual memory and non-virtual memory, magnetic cassettes, magnetic tape, magnetic disk storage or other magnetic storage devices, or any other suitable storage media. In no case is the computer readable storage media a propagated signal.

In addition to computer readable storage media, in some implementations storage system 703 may also include computer readable communication media over which at least some of software 705 may be communicated internally or externally. Storage system 703 may be implemented as a single storage device but may also be implemented across multiple storage devices or sub-systems co-located or distributed relative to each other. Storage system 703 may comprise additional elements, such as a controller, capable of communicating with processing system 702 or possibly other systems.

Software 705 is implemented in program instructions 706 and among other functions may, when executed by processing system 702, direct processing system 702 to operate as described with respect to the various operational scenarios, sequences, and processes illustrated herein. In particular, the program instructions may include various components or modules that cooperate or otherwise interact to carry out the various processes and operational scenarios described herein. The various components or modules may be embodied in compiled or interpreted instructions, or in some other variation or combination of instructions. The various components or modules may be executed in a synchronous or asynchronous manner, serially or in parallel, in a single threaded environment or multi-threaded, or in accordance with any other suitable execution paradigm, variation, or combination thereof. Software 705 may include additional processes, programs, or components, such as operating system software, virtualization software, or other application software. Software 705 may also comprise firmware or some other form of machine-readable processing instructions executable by processing system 702.

In general, software 705 may, when loaded into processing system 702 and executed, transform a suitable apparatus, system, or device (of which computing device 701 is representative) overall from a general-purpose computing system into a special-purpose computing system customized to support binary convolution operations. Indeed, encoding software 705 (and testing procedure 708) on storage system 703 may transform the physical structure of storage system 703. The specific transformation of the physical structure may depend on various factors in different implementations of this description. Examples of such factors may include, but are not limited to, the technology used to implement the storage media of storage system 703 and whether the computer-storage media are characterized as primary or secondary, etc.

For example, if the computer readable storage media are implemented as semiconductor-based memory, software 705 may transform the physical state of the semiconductor memory when the program instructions are encoded therein, such as by transforming the state of transistors, capacitors, or other discrete circuit elements constituting the semiconductor memory. A similar transformation may occur with respect to magnetic or optical media. Other transformations of physical media are possible without departing from the scope of the present description, with the foregoing examples provided only to facilitate the present discussion.

Communication interface system 707 may include communication connections and devices that allow for communication with other computing systems (not shown) over communication networks (not shown). Examples of connections and devices that together allow for inter-system communication may include network interface cards, antennas, power amplifiers, RF circuitry, transceivers, and other communication circuitry. The connections and devices may communicate over communication media to exchange communications with other computing systems or networks of systems, such as metal, glass, air, or any other suitable communication media. The aforementioned media, connections, and devices are well known and need not be discussed at length here.

Communication between computing device 701 and other computing systems (not shown), may occur over a communication network or networks and in accordance with various communication protocols, combinations of protocols, or variations thereof. Examples include intranets, internets, the Internet, local area networks, wide area networks, wireless networks, wired networks, virtual networks, software defined networks, data center buses and backplanes, or any other type of network, combination of network, or variation thereof. The aforementioned communication networks and protocols are well known and need not be discussed at length here.

As will be appreciated by one skilled in the art, aspects of the present invention may be embodied as a system, method, or computer program product. Accordingly, aspects of the present invention may take the form of an entirely hardware implementation, an entirely software implementation (including firmware, resident software, micro-code, etc.) or an implementation combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Indeed, the included descriptions and figures depict specific implementations to teach those skilled in the art how to make and use the best mode. For the purpose of teaching inventive principles, some conventional aspects have been simplified or omitted. Those skilled in the art will appreciate variations from these implementations that fall within the scope of the disclosure. Those skilled in the art will also appreciate that the features described above may be combined in various ways to form multiple implementations. As a result, the invention is not limited to the specific implementations described above, but only by the claims and their equivalents.

The above description and associated figures teach the best mode of the invention. The following claims specify the scope of the invention. Note that some aspects of the best mode may not fall within the scope of the invention as specified by the claims. Those skilled in the art will appreciate that the features described above can be combined in various ways to form multiple variations of the invention. Thus, the invention is not limited to the specific embodiments described above, but only by the following claims and their equivalents.

What is claimed is:

1. A method comprising:

while a set of circuit devices is disconnected from a test structure:

supplying an input voltage at an input node of the test structure;

determining a first measure of current at the input node of the test structure; and determining a first measure of voltage at an output node of the test structure;

connecting a device of the set of circuit devices to the test structure;

while the device is connected to the test structure:

adjusting the input voltage at the input node until a second measure of voltage at the output node substantially matches the first measure of voltage; and determining a second measure of current at the input node of the test structure; and determining a parametric measurement of the device based on a difference between the first measure of current and the second measure of current.

2. The method of claim 1 wherein the first measure of current is indicative of a null current leakage on lines of the test structure that occurs when the set of circuit devices is disconnected from the test structure.

3. The method of claim 2 wherein the second measure of current is indicative of an under-test current leakage on the lines of the test structure that occurs when the device is connected to the test structure.

4. The method of claim 1 wherein adjusting the input voltage at the input node until the second measure of voltage at the output node substantially matches the first measure of voltage comprises sweeping the input voltage across a range until the second measure of voltage is equal to or differs from the first measure of voltage less than or equal to a threshold amount.

5. The method of claim 4 wherein the test structure includes a test circuit comprising a first resistance and a second resistance occurring in series between the input node and the output node, wherein the input node comprises a first pin shared with a first input/output (I/O) circuit, and wherein the output node comprises a second pin shared with a second I/O circuit.

6. The method of claim 5 wherein the set of circuit devices comprise transistors, and wherein the device is connected to the test circuit at a node between the first resistance and the second resistance.

7. The method of claim 1 further comprising connecting remaining ones of the set of circuit devices to the test structure and determining measurements of the remaining ones.

8. An apparatus comprising:

a measurement unit configured to:

during an initial stage while a set of circuit devices is disconnected from a test structure, determine a first measure of current at an input node of the test structure and determine a first measure of voltage at an output node of the test structure; and during a subsequent stage while a device of the set of circuit devices is connected to the test structure, adjust an input voltage at the input node until a second measure of voltage at the output node substantially matches the first measure of voltage, and determine a second measure of current at the input node of the test structure; and a control unit configured to determine a parametric measurement of the device based on a difference between the first measure of current and second measure of current.

9. The apparatus of claim 8 wherein the first measure of current is indicative of a null current leakage on lines of the test structure that occurs when the set of circuit devices is disconnected from the test structure.

10. The apparatus of claim 9 wherein the second measure of current is indicative of an under-test current leakage on the lines of the test structure that occurs when the device is connected to the test structure.

11. The apparatus of claim 8 wherein to adjust the input voltage at the input node, the measurement unit is further configured to sweep the input voltage across a range until the second measure of voltage is equal to or differs from the first measure of voltage less than or equal to a threshold amount.

12. The apparatus of claim 11 wherein the test structure includes a test circuit comprising a first resistance and a second resistance occurring in series between the input node and the output node, and wherein the input node comprises a first pin shared with a first input/output (I/O) circuit, and wherein the output node comprises a second pin shared with a second I/O circuit.

13. The apparatus of claim 12 wherein the set of circuit devices comprise transistors, and wherein the device is connected to the test circuit at a node between the first resistance and the second resistance.

14. The apparatus of claim 8 wherein the measurement unit is further configured to:

connect remaining ones of the set of circuit devices to the test structure; and determine parametric measurements of the remaining ones.

15. A computing apparatus comprising:

one or more computer readable storage media; and program instructions stored on the one or more computer readable storage media;

wherein the program instructions, when executed by one or more processors, direct a testing apparatus to at least:

while a set of circuit devices is disconnected from a test structure:

supply an input voltage at an input node of the test structure;

determine a first measure of current at the input node of the test structure; and determine a first measure of voltage at an output node of the test structure;

connect a device of the set of circuit devices to the test structure;

while the device is connected to the test structure:

adjust the input voltage at the input node until a second measure of voltage at the output node substantially matches the first measure of voltage; and determine a second measure of current at the input node of the test structure; and determine a parametric measurement of the device based on a difference between the first measure of current and the second measure of current.

16. The computing apparatus of claim 15 wherein the first measure of current is indicative of a null current leakage on lines of the test structure that occurs when the set of circuit devices is disconnected from the test structure, and wherein the second measure of current is indicative of an under-test current leakage on the lines of the test structure that occurs when the device is connected to the test structure.

17. The computing apparatus of claim 15 wherein to adjust the input voltage at the input node, the program instructions further direct the testing apparatus to sweep the input voltage across a range until the second measure of voltage is equal to or differs from the first measure of voltage less than or equal to a threshold amount.

18. The computing apparatus of claim 17 wherein the test structure includes a test circuit comprising a first resistance and a second resistance connected in series between the input node and the output node, and wherein the input node comprises a first pin shared with a first input/output (I/O) circuit, and wherein the output node comprises a second pin shared with a second I/O circuit.

19. The computing apparatus of claim 18 wherein the set of circuit devices comprise transistors, and wherein the device is connected to the test circuit at a node between the first resistance and the second resistance.

20. The computing apparatus of claim 15 wherein the program instructions further direct the testing apparatus to:

connect remaining ones of the set of circuit devices to the test structure; and determine a parametric measurement of the remaining ones.

* * * * *